(12) United States Patent
Huang et al.

(10) Patent No.: US 10,748,898 B2
(45) Date of Patent: Aug. 18, 2020

(54) METAL GATE STRUCTURE AND METHODS THEREOF

(71) Applicant: Taiwan Semiconductor Manufacturing Co., Ltd., Hsinchu (TW)

(72) Inventors: Ming-Chi Huang, Hsinchu County (TW); Ying-Liang Chuang, Hsinchu County (TW); Ming-Hsi Yeh, Hsinchu (TW); Kuo-Bin Huang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/404,101

(22) Filed: May 6, 2019

(65) Prior Publication Data
US 2019/0326282 A1    Oct. 24, 2019

Related U.S. Application Data

(63) Continuation of application No. 15/799,555, filed on Oct. 31, 2017, now Pat. No. 10,283,503.
(Continued)

(51) Int. Cl.
*H01L 27/088* (2006.01)
*H01L 21/8234* (2006.01)
(Continued)

(52) U.S. Cl.
CPC .... *H01L 27/0886* (2013.01); *H01L 21/31111* (2013.01); *H01L 21/32135* (2013.01); *H01L 21/32139* (2013.01); *H01L 21/823431* (2013.01); *H01L 21/823437* (2013.01); *H01L 21/823821* (2013.01); *H01L 21/823878* (2013.01); *H01L 27/0924* (2013.01);
(Continued)

(58) Field of Classification Search
CPC ..... H01L 21/823456; H01L 21/823431; H01L 21/31111; H01L 21/32135; H01L 21/32139; H01L 27/0886; H01L 29/0649; H01L 29/42376; H01L 29/66545
See application file for complete search history.

(56) References Cited

U.S. PATENT DOCUMENTS

| 8,629,512 B2 | 1/2014 | Liaw |
| 8,772,109 B2 | 7/2014 | Colinge |

(Continued)

FOREIGN PATENT DOCUMENTS

| DE | 102012111082 | 10/2013 |
| KR | 20160102787 | 8/2016 |

(Continued)

*Primary Examiner* — Christine A Enad
(74) *Attorney, Agent, or Firm* — Haynes and Boone, LLP

(57) ABSTRACT

Provided is a metal gate structure and related methods that include performing a metal gate cut process. The metal gate cut process includes a plurality of etching steps. For example, a first anisotropic dry etch is performed, a second isotropic dry etch is performed, and a third wet etch is performed. In some embodiments, the second isotropic etch removes a residual portion of a metal gate layer including a metal containing layer. In some embodiments, the third etch removes a residual portion of a dielectric layer.

20 Claims, 11 Drawing Sheets

Related U.S. Application Data

(60) Provisional application No. 62/539,357, filed on Jul. 31, 2017.

(51) Int. Cl.
*H01L 21/3213* (2006.01)
*H01L 21/311* (2006.01)
*H01L 29/66* (2006.01)
*H01L 29/49* (2006.01)
*H01L 29/51* (2006.01)
*H01L 29/06* (2006.01)
*H01L 29/423* (2006.01)
*H01L 21/8238* (2006.01)
*H01L 27/092* (2006.01)

(52) U.S. Cl.
CPC .... *H01L 29/0649* (2013.01); *H01L 29/42376* (2013.01); *H01L 29/4966* (2013.01); *H01L 29/4975* (2013.01); *H01L 29/517* (2013.01); *H01L 29/66545* (2013.01); *H01L 21/823828* (2013.01)

(56) References Cited

U.S. PATENT DOCUMENTS

| | | | |
|---|---|---|---|
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,508,719 B2 | 11/2016 | Chen et al. | |
| 9,520,482 B1 | 12/2016 | Chang et al. | |
| 9,553,090 B2 | 1/2017 | Chang et al. | |
| 9,576,814 B2 | 2/2017 | Wu et al. | |
| 9,627,379 B1 | 4/2017 | Chang et al. | |
| 9,842,778 B2 | 12/2017 | You et al. | |
| 9,887,136 B2 | 2/2018 | Chang et al. | |
| 9,899,267 B1* | 2/2018 | Liou | H01L 21/823878 |
| 2008/0194068 A1 | 8/2008 | Temmler et al. | |
| 2015/0228647 A1* | 8/2015 | Chang | H01L 21/823431 |
| | | | 257/401 |
| 2016/0056181 A1 | 2/2016 | Anderson et al. | |
| 2017/0148682 A1 | 5/2017 | Veeraraghava et al. | |
| 2017/0213828 A1 | 7/2017 | Chang et al. | |
| 2018/0012996 A1 | 1/2018 | Baldauf et al. | |
| 2018/0019263 A1 | 1/2018 | Kong et al. | |

FOREIGN PATENT DOCUMENTS

| | | |
|---|---|---|
| KR | 20160140321 | 12/2016 |
| TW | 201620135 | 6/2016 |

\* cited by examiner

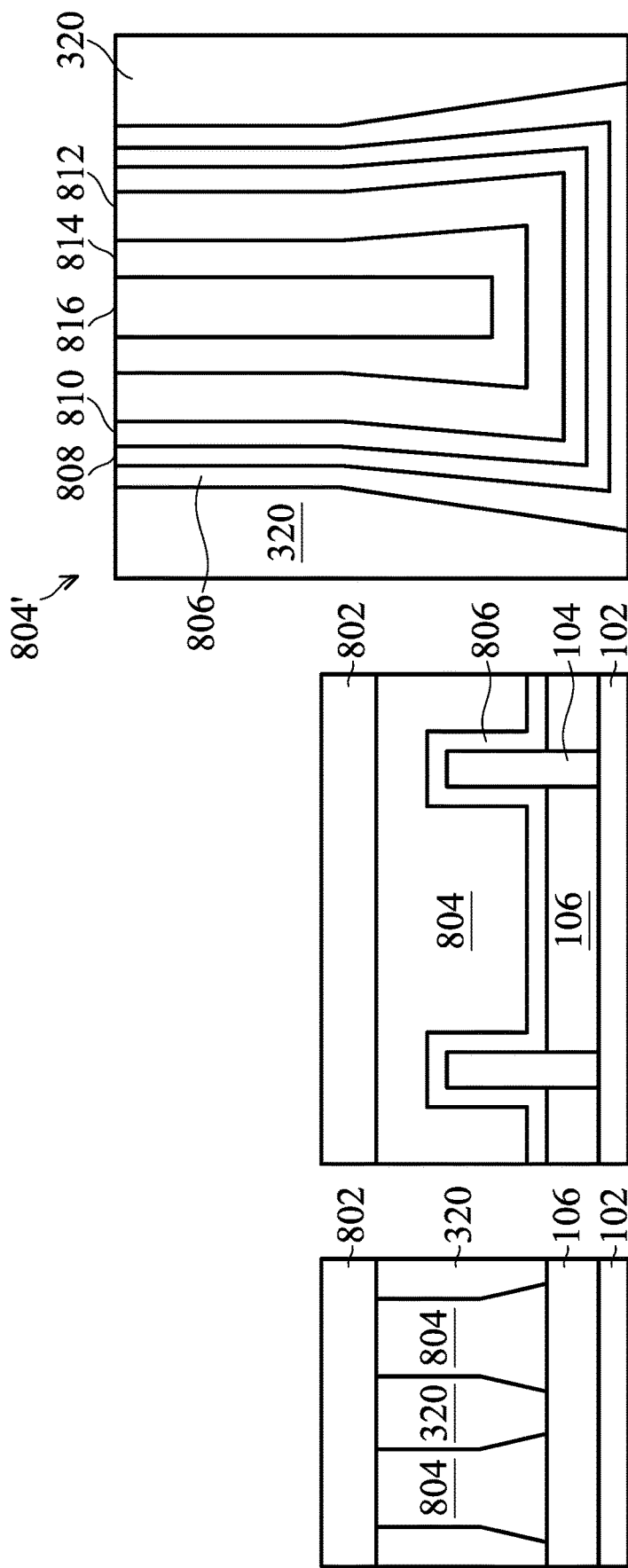

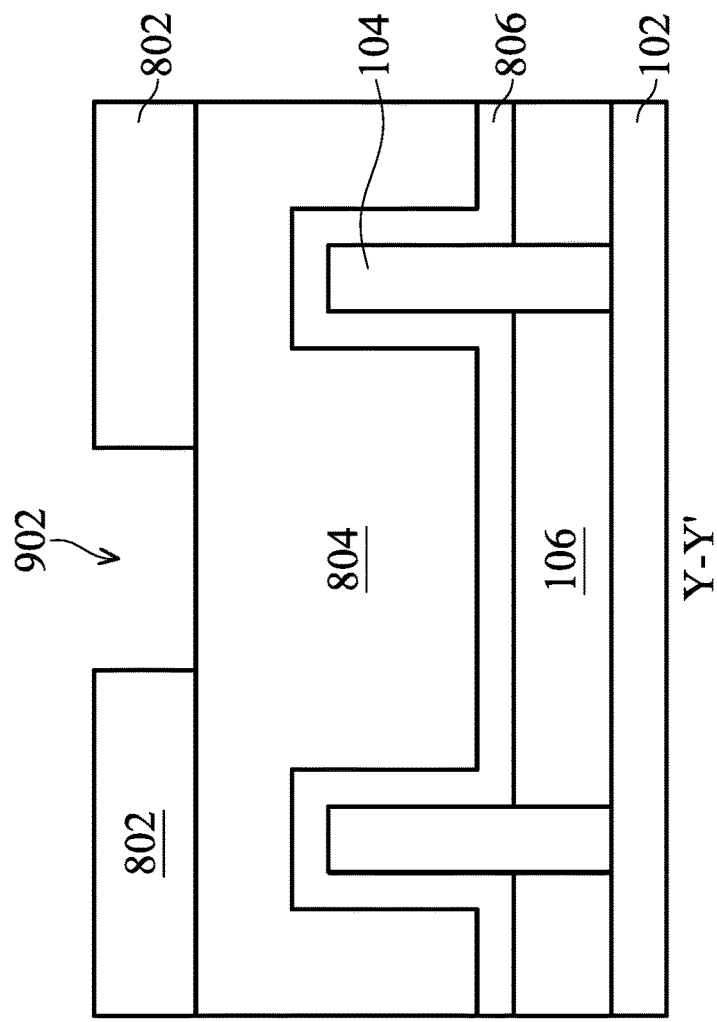
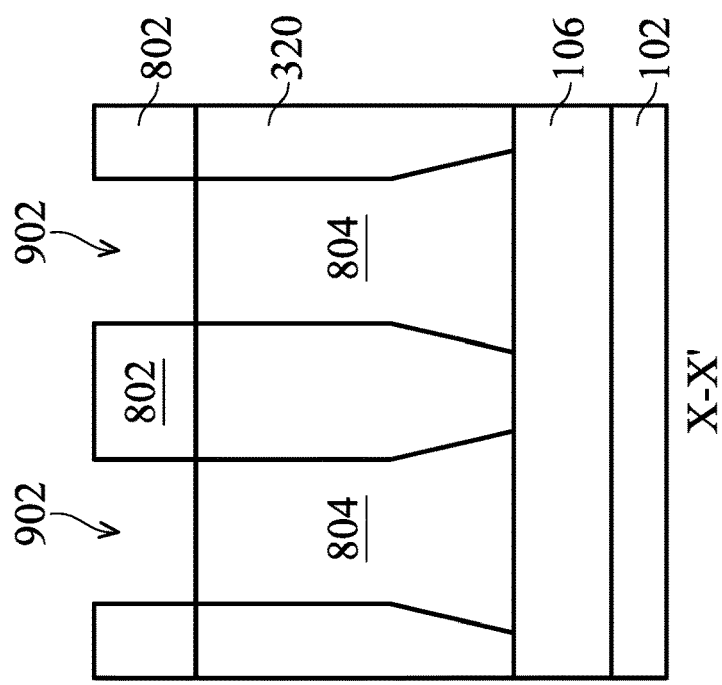
FIG. 9A
FIG. 9B

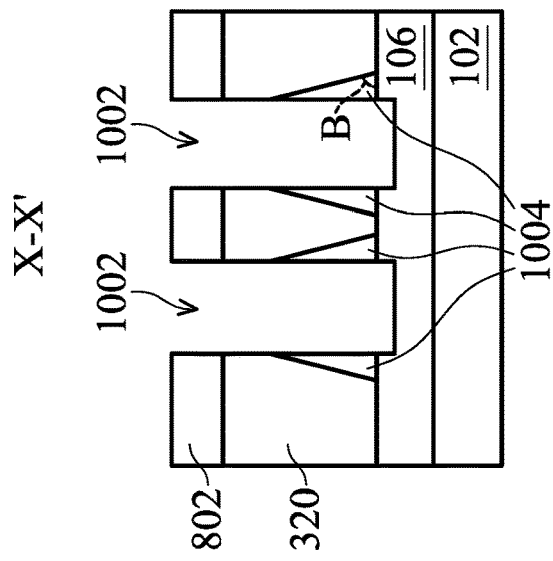
FIG. 10A
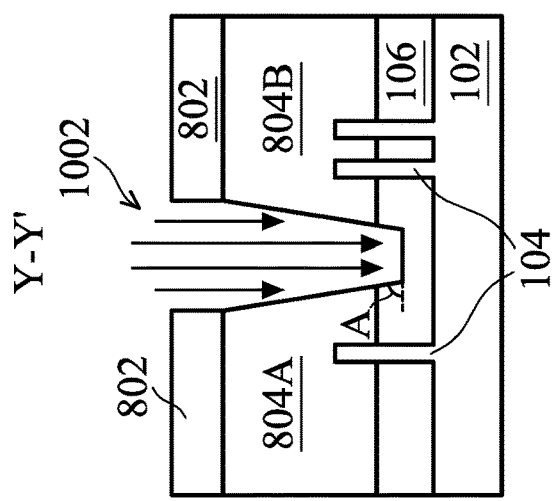
FIG. 10B
FIG. 10C

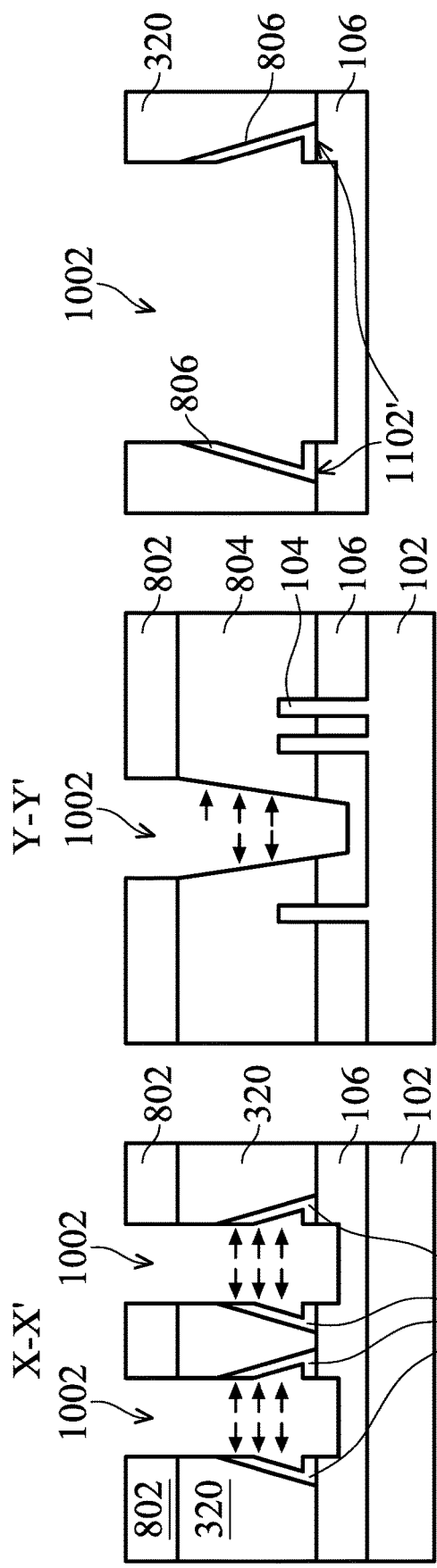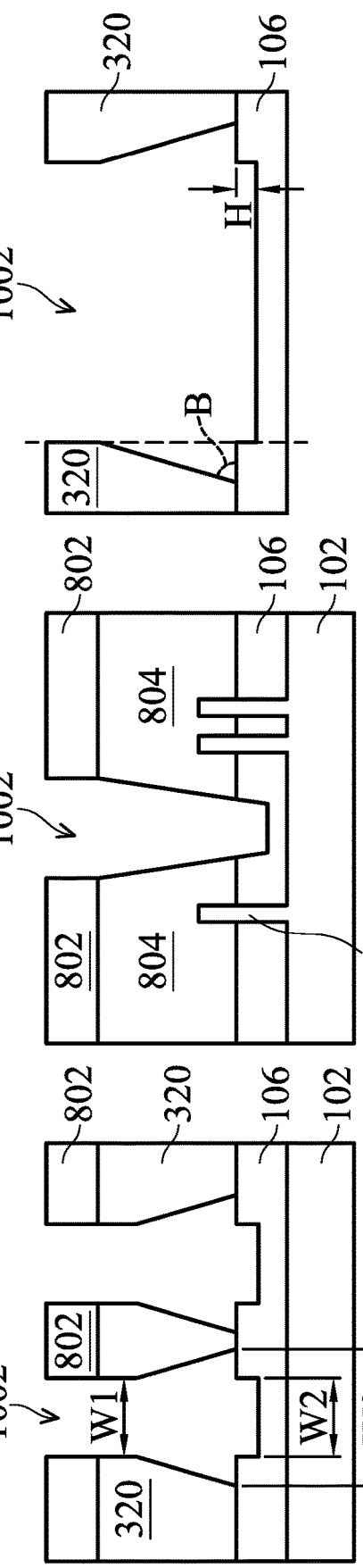

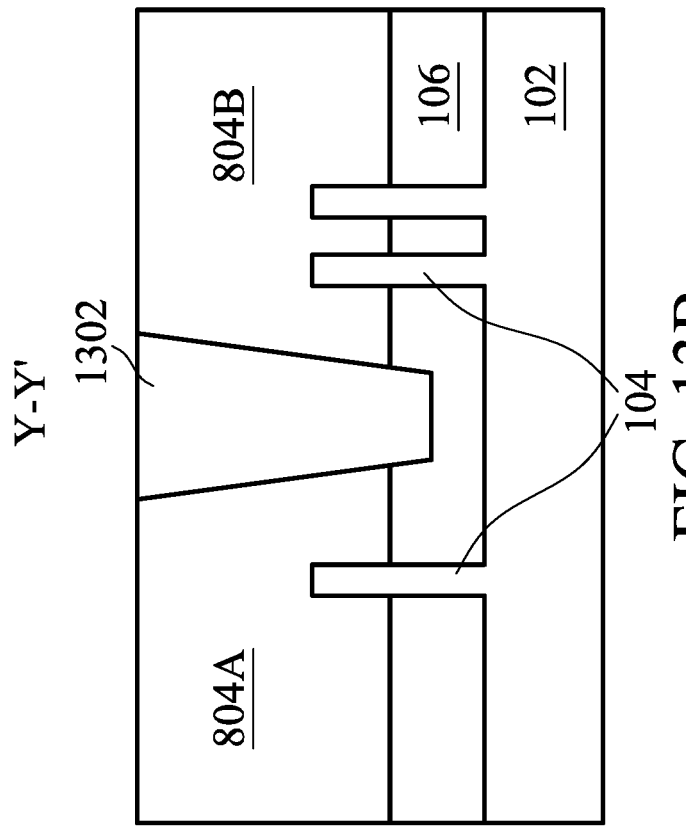
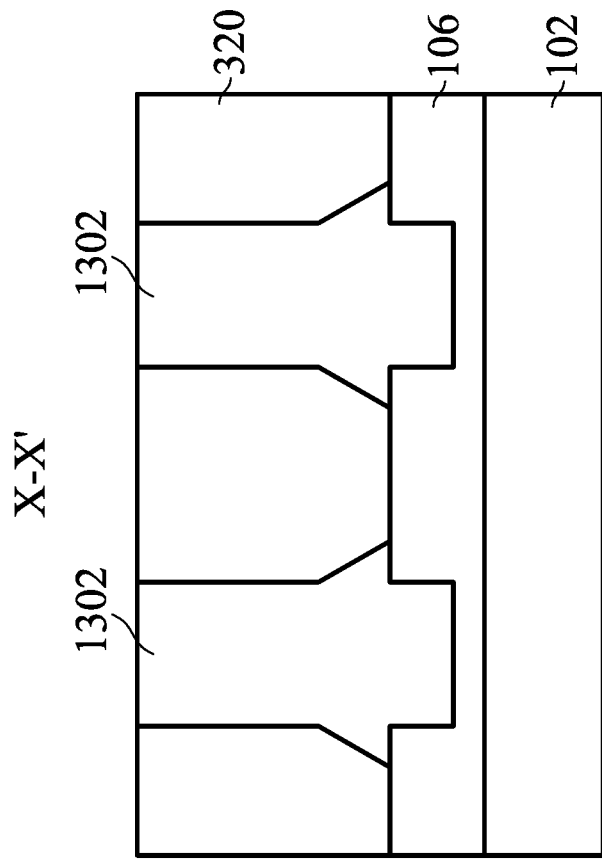

METAL GATE STRUCTURE AND METHODS THEREOF

CROSS-REFERENCE TO RELATED APPLICATION

This application is a continuation of and claims priority to U.S. application Ser. No. 15/799,555 issuing as U.S. Pat. No. 10,283,503, which claims the benefit of U.S. Provisional Application No. 62/539,357, filed Jul. 31, 2017, each of which is hereby incorporated by reference in its entirety.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. In addition, metal gate electrodes have been introduced as a replacement to polysilicon gate electrodes. Metal gate electrodes provide a number of advantages over polysilicon gate electrodes such as avoidance of the polysilicon depletion effect, work-function tuning by selection of appropriate gate metal(s), as well as other benefits. By way of example, a metal gate electrode fabrication process may include a metal layer deposition followed by a subsequent metal layer cut process. In some cases, the metal gate line cut process may result in loss of portions of an inter-layer dielectric (ILD), undesired residue of the metal layer(s), and/or other issues including those that can lead to degraded device reliability.

Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A, 7A, 8A, 9A, 10A, 11A, 12A, and 13A show cross-section views of a FinFET structure along a plane substantially parallel to a plane defined by section XX' of FIG. 1, and fabricated according to an embodiment of the method of FIG. 5;

FIGS. 6B, 7B, 8B, 9B, 10B, 11B, 12B, and 13B show cross-section views of the FinFET structure along a plane substantially parallel to a plane defined by section YY' of FIG. 1, and fabricated according to an embodiment of the method of FIG. 5; and FIGS. 8C, 10C, 11C, and 12C show cross-section views of a gate structure corresponding to the cross-section of FIGS. 8A, 10A, 11A, and 12A respectively and illustrative of additional details as to the layer(s) of the gate structure, according to some embodiments of the present disclosure.

DETAILED DESCRIPTION

Figure 1:
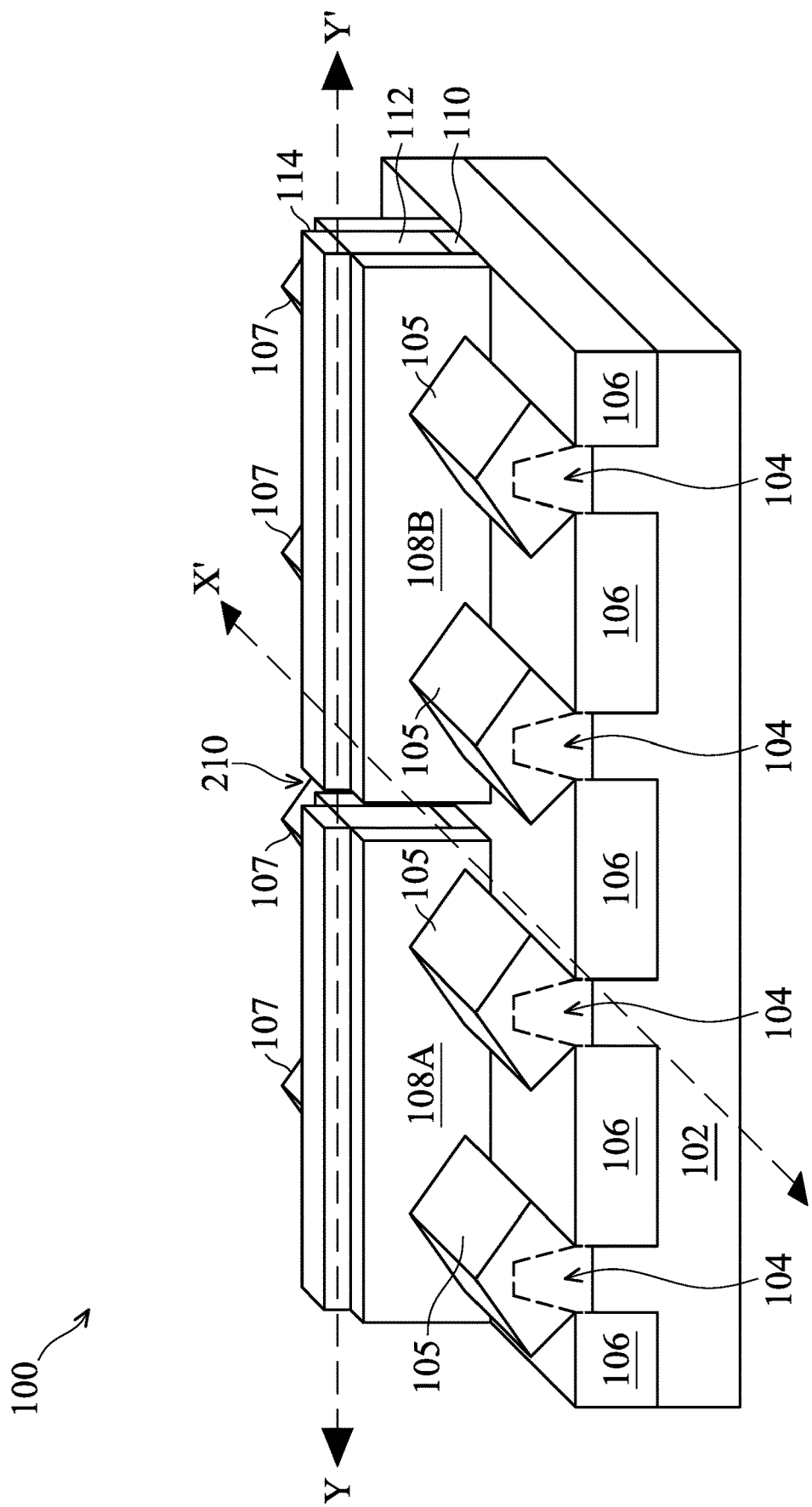
FIG. 1 is perspective view of an embodiment of a FinFET device according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices.

Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices. In other embodiments, a planar device may be fabricated using one or more of the structures or methods discussed herein.

The present application is generally related to a metal gate structure and related methods. In particular, the present disclosure is directed to a metal gate cut process and related structure. Metal gate electrodes have been introduced as a replacement to polysilicon gate electrodes. Metal gate electrodes provide a number of advantages over polysilicon gate electrodes such as avoidance of the polysilicon depletion effect, work-function tuning by selection of appropriate gate metal(s), as well as other benefits. By way of example, a metal gate electrode fabrication process may include metal layer(s) deposition followed by a subsequent metal layer cut processes.

Embodiments of the present disclosure offer advantages over the existing art, though it is understood that other embodiments may offer different advantages, not all advantages are necessarily discussed herein, and no particular advantage is required for all embodiments. Generally, and in accordance with embodiments disclosed herein, a metal gate cut process and related structures are provided. At least some embodiments of the present disclosure may be used to increase control of the cut process to provide for, for example, reduced the risk of residue of the metal gate structure being maintained on the surrounding layer(s) (e.g., ILD) after the cut process. For example, in at least some existing processes, a metal gate includes a plurality of differently composed layers one or more of which may undesirably not be completely removed from the cut region. This can result in undesired performance issues such as loss of desired isolation properties (e.g., decreased electron base insulator (EBI) performance). Certain embodiments of the methods and devices presented herein provide for reducing and/or eliminating this residue without the loss surrounding materials such as patterned hard mask. This can allow for improved process windows for the metal gate-cut process. One or more of the processes presented can also in some embodiments reduce over etching of metal components during lateral etching.

To mitigate one or more of the issues, including for example undesired metal gate residue after etching, some embodiments of the present disclosure provide a metal gate structure and method of performing a metal gate-cut processes that performs one or more etch processes to target the metal gate-cut.

Illustrated in FIG. 1 is a FinFET device 100. Various embodiments disclosed herein may be used to fabricate the FinFET device 100 and/or may be present in the final structure of the FinFET device 100. The FinFET device 100 includes one or more fin-based, multi-gate field-effect transistors (FETs). The FinFET device 100 includes a substrate 102, at least one fin element 104 extending from the substrate 102, isolation regions 106, and a gate structure 108 disposed on and around the fin-element 104. The substrate 102 may be a semiconductor substrate such as a silicon substrate. The substrate may include various layers, including conductive or insulating layers formed on a semiconductor substrate. The substrate may include various doping configurations depending on design requirements as is known in the art. The substrate may also include other semiconductors such as germanium, silicon carbide (SiC), silicon germanium (SiGe), or diamond. Alternatively, the substrate may include a compound semiconductor and/or an alloy semiconductor. Further, in some embodiments, the substrate may include an epitaxial layer (epi-layer), the substrate may be strained for performance enhancement, the substrate may include a silicon-on-insulator (SOI) structure, and/or the substrate may have other suitable enhancement features.

The fin-element 104, like the substrate 102, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the making element may be performed using an extreme ultraviolet (EUV) lithography process or an electron beam (e-beam) lithography process. The masking element may then be used to protect regions of the substrate while an etch process forms recesses into the silicon layer, thereby leaving an extending fin 104. The recesses may be etched using a dry etch (e.g., chemical oxide removal), a wet etch, and/or other suitable processes. Numerous other embodiments of methods to form the fins 104 on the substrate 102 may also be used.

Each of the plurality of fins 104 also include a source region 105 and a drain region 107 where the source/drain regions 105, 107 are formed in, on, and/or surrounding the fin 104. The source/drain regions 105, 107 may be epitaxially grown over the fins 104. A channel region of a transistor is disposed within the fin 104, underlying the gate structure 108. In some examples, the channel region of the fin includes a high-mobility material such as germanium, as well as any of the compound semiconductors or alloy semiconductors discussed above and/or combinations thereof. High-mobility materials include those materials with an electron mobility greater than silicon.

The isolation regions 106 may be shallow trench isolation (STI) features. Alternatively, a field oxide, a LOCOS feature, and/or other suitable isolation features may be implemented on and/or within the substrate 102. The isolation regions 106 may be composed of silicon oxide, silicon nitride, silicon oxynitride, fluorine-doped silicate glass (FSG), a low-k dielectric, combinations thereof, and/or other suitable material known in the art. In an embodiment, the isolation structures are STI features and are formed by etching trenches in the substrate 102. The trenches may then be filled with isolating material, followed by a chemical mechanical polishing (CMP) process. However, other embodiments are possible. In some embodiments, the isolation regions 106 may include a multi-layer structure, for example, having one or more liner layers.

The gate structure 108 includes a gate stack having in some embodiments an interfacial layer formed over the channel region of the fin 104, a gate dielectric layer 110 formed over the interfacial layer, and a metal layer 112 formed over the gate dielectric layer 110. The interfacial layer may include a dielectric material such as silicon oxide layer ($SiO_2$) or silicon oxynitride (SiON). The interfacial layer may be formed by chemical oxidation, thermal oxidation, atomic layer deposition (ALD), chemical vapor deposition (CVD), and/or other suitable method. The gate dielectric layer 110 may include a high-k dielectric layer such as hafnium oxide ($HfO_2$). Alternatively, the high-k dielectric layer may include other high-k dielectrics, such as $TiO_2$, HfZrO, $Ta_2O_3$, $HfSiO_4$, $ZrO_2$, $ZrSiO_2$, combinations thereof, or other suitable material. In still other embodiments, the gate dielectric layer may include silicon dioxide or other suitable dielectric. The dielectric layer may be formed by ALD, physical vapor deposition (PVD), oxidation, and/or other suitable methods. The metal layer 112 is representative of one or more metal compositions and may include a conductive layer such as W, TiN, TaN, WN, Re, Ir, Ru, Mo, Al, Co, Ni, combinations thereof, and/or other suitable compositions. In some embodiments, the metal layer 112 may include a first metal material for N-type FinFETs and a second metal material for P-type FinFETs. Thus the FinFET device 100 may include a dual workfunction metal gate configuration. For example, the first metal material (e.g., for N-type devices) may include metals having a work function substantially aligned with a work function of the substrate conduction band, or at least substantially aligned with a work function of the conduction band of the channel region of the fin 104. Similarly, for example, the second metal material (e.g., for P-type devices) may include metals having a work function substantially aligned with a work function of the substrate valence band, or at least substantially aligned with a work function of the valence band of the channel region of the fin 104. The metal layer 112 may include various layers in addition and including those providing the work function including, for example, barrier layers, seed layers, capping layers, fill layers, and/or other suitable compositions and functions including those discussed below. Thus, the metal layer 112 may provide a gate electrode for the FinFET device 100, including both N-type and P-type FinFET devices 100. The metal layer 112 may be formed using PVD, CVD, electron beam (e-beam) evaporation, and/or other suitable process. In some embodiments, sidewall spacers are formed on sidewalls of the gate structure 108. The sidewall spacers may include a dielectric material such as silicon oxide, silicon nitride, silicon carbide, silicon oxynitride, or combinations thereof. A hard mask layer 114 (e.g., silicon nitride) may be disposed over regions of the metal layer 112 of the gate structure 108.

It is noted that an interlayer dielectric (ILD) layer may be disposed on the substrate 102 including over the isolation regions 106 and source/drain regions 105/107. The ILD layer is not illustrated for ease of illustration of the other layers. As discussed below, a metal gate cut pattern 210 provides for defining a region where a portion of the gate structure 108 is removed providing discontinuous segments (108A, 108B) of the gate structure 108. The region of the metal gate cut pattern 210 may be filled with insulating material, including as discussed in the examples below such as FIGS. 3 and 4.

Figure 2:
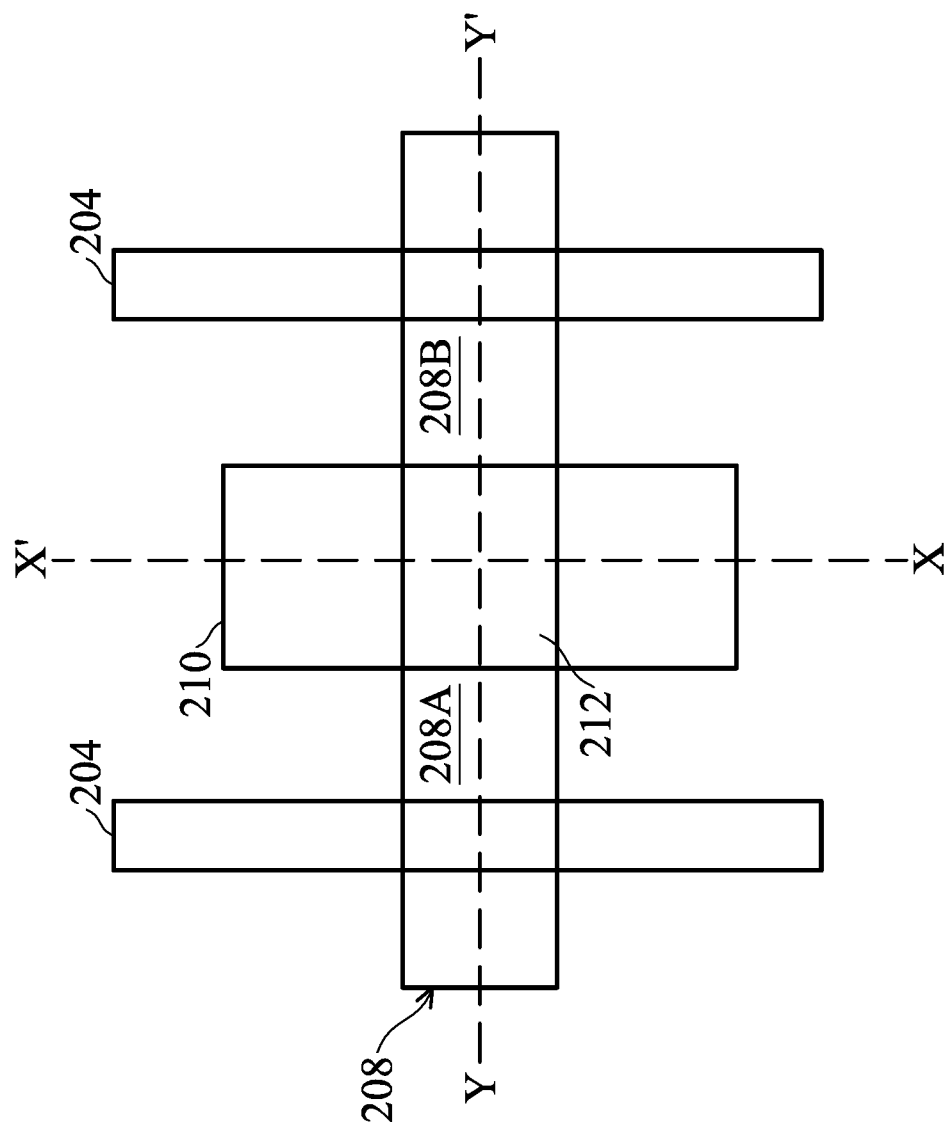
FIG. 2 is a top-view of neighboring fins, a metal gate structure, and a metal gate cut pattern, in accordance with some embodiments.

Referring now to FIG. 2, illustrated therein is a top-view of neighboring fins 204 and a metal gate structure 208 disposed over and substantially perpendicular to the fins 204. In some embodiments, section XX' of FIG. 2 may be substantially parallel to the plane defined by section XX' of FIG. 1, and section YY' of FIG. 2 may be substantially parallel to the plane defined by section YY' of FIG. 1. In some cases, the fins 204 may be substantially the same as fins 104 described above, and the metal gate structure 208 may be similar in at least some aspects to the gate structure 108 described above. By way of example, FIG. 2 also shows a metal gate cut pattern 210, which in some examples may be defined by a patterned hard mask layer (including as discussed below). In some embodiments, the metal gate cut pattern 210 provides an opening (e.g., in the patterned hard mask layer) through which a metal gate line-cut process is performed and a portion 212 of a metal gate structure 208 under the opening may be cut such that the metal gate structure is removed from the substrate in the opening providing first and second portions of discontinuous metal gate structure segments (e.g., 208A, 208B of FIG. 2 substantially similar to 108A, 108B of FIG. 1). A metal gate line-cut process, as described herein, may include a dry etch process, a wet etch process, or a combination thereof as discussed in detail below, which is used to remove a portion of the metal gate structure 208 within an area defined by the metal gate cut pattern 210. By way of example, the metal gate line-cut process may be used to cut a metal gate line into separate, electrically disconnected and discontinuous line segments 208A and 208. In some embodiments, a dielectric layer may be formed within a line-cut region (e.g., where the portion of the metal gate layer has been removed) as part of the metal gate line-cut process. As illustrated the metal gate cut pattern 210 may overlay an isolation region disposed on the substrate, such as isolation regions 106 of FIG. 1. However, in other embodiments, a metal gate cut pattern 210 may overlie a fin such as fin 204, for example, where the fin 204 underlying the metal gate cut pattern 210 is a dummy fin in whole or in part.

Figure 4:
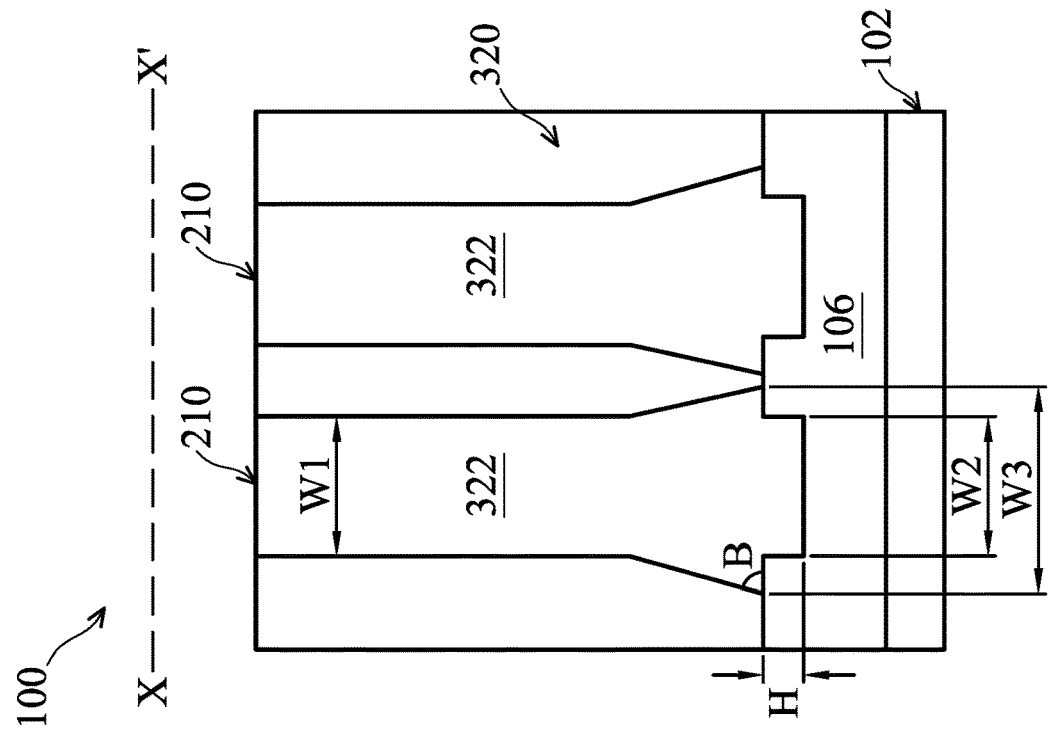
FIG. 4 illustrates a corresponding cross-section view of a FinFET structure, in which a metal gate line has been cut, in accordance with embodiments of the present disclosure.
Figure 3:
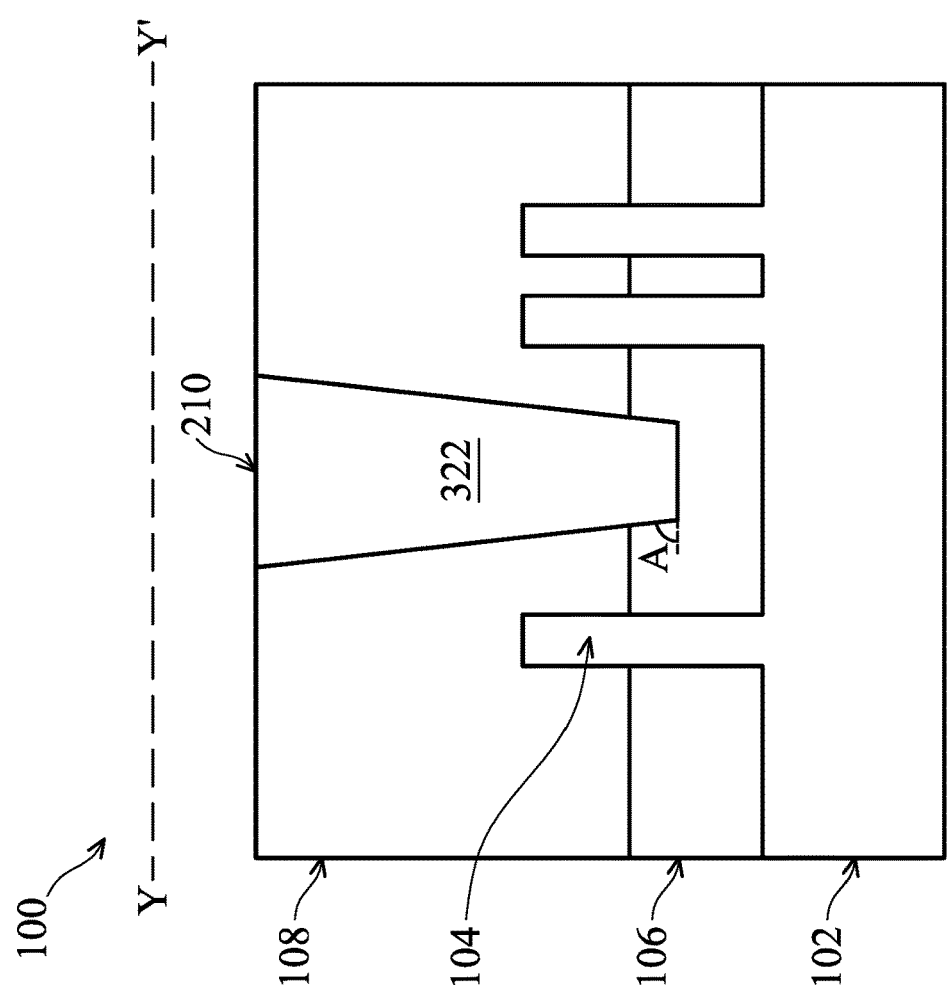
FIG. 3 illustrates a cross-section view of a FinFET structure, in which a metal gate line has been cut, in accordance with embodiments of the present disclosure.

With reference to FIG. 3, illustrated therein is a cross-sectional view of a portion of the FinFET structure 100, along a plane substantially parallel to a plane defined by section YY' of FIG. 1. With reference to FIG. 4, illustrated therein is a cross-sectional view of a portion of the FinFET structure 100, along a plane substantially parallel to a plane defined by section XX' of FIG. 1. The FinFET structure 100 includes the metal gate structure 108 that has been cut (108A, 108B). The metal gate structure 108 may be cut in accordance with some embodiments discussed herein including with respect to FIG. 5. The FinFET structure 100 may include one or more of the features described above with reference to the FIGS. 1 and 2 such as fin elements 104 extending from a substrate 102, isolation regions 106, and the gate structure 108 disposed on and around the fin-elements 104. The gate structure 108 may be substantially similar to the gate structure 108 of FIG. 1 and/or the gate structure 208 of FIG. 2 discussed above. The gate structure 108 may be a metal gate structure such as a gate stack having a gate dielectric layer and metal layer(s) formed over the gate dielectric layer. In some examples, the metal layer may include a plurality of metal materials including, for example, a first metal material (e.g., such as a P-type work function metal (PWFM)), a second metal material (e.g., such as an N-type work function metal (NWFM)) over the first metal material, and a third metal material (e.g., such as fill metal (e.g., tungsten)) over the second metal material and so forth. FIG. 3 further shows a metal gate cut region 210, where the gate structure 108 is cut such that it is discontinuous, and which may be formed as part of a metal gate line-cut processes as described herein. In various cases, at a subsequent processing step, a dielectric layer 322 may be formed within the region of the metal gate cut 210 and interposing the gate segments 108A, 108B. The dielectric layer 322 may be a different dielectric composition than material of the isolation regions 106 and/or the dielectric material of the adjacent ILD layer, illustrated as ILD layer 320. The ILD layer 320 may be formed by chemical vapor deposition (CVD) or other suitable deposition processes and in some embodiments may be planarized after deposition. The ILD layer 320 may include, as non-limiting examples of its composition, silicon dioxide, silicon nitride, silicon oxynitride, carbon containing dielectrics, TEOS, and combinations of these, and may be low-k, high-k or oxide dielectric, and may be formed of other known materials for ILD layers. It is noted that the ILD layer 320 is illustrated as a single layer but the device would typically also include other dielectric materials such as spacer elements, etch stop layers, and the like.

FIG. 3 illustrates the metal gate cut region 210 extends down past a top surface of the STI 106 (e.g., the cut has an over-etch into the STI 106). However, in other embodiments, the metal gate-cut will extend to the top surface of the STI structure 106 or may extend through the STI structure 106 to the substrate 102. FIG. 3 illustrates the dielectric 322 filling the cut region 210 has an angle A with respect to a plane parallel a top surface of the STI 106. In some embodiments, the angle A is between approximately 80 and 90 degrees.

It is noted that the profile of the cut region 210 has a profile characterized by a larger width W3 at a point coplanar with a top surface of the STI 106 as illustrated in FIG. 4. The larger width W3 tapers to a substantially constant width W1 in an upper portion. The lower portion, below the larger width, may also get substantially constant width W2. In an embodiment, W1 and W2 are substantially equal. In an embodiment, sidewalls that define the upper region having a width W1 and the sidewalls that define the lower portion having a width W2 are collinear. In an embodiment, the bottom portion has a height H below a top surface of the STI 106. The height H may be between approximately 10% and 70% of a thickness of the STI 106. In an embodiment, the taper of the profile from width W3 to width W1 at an angle B between approximately 75 degrees and approximately 90 degrees with respect to a plane parallel a top surface of the STI 106. In other words, in some embodiments the sidewalls of the dielectric layer 322 filling the cut region are disposed orthogonal to a top surface of the underlying substrate. In some embodiments, the sidewalls of the dielectric layer 322 are disposed at an angle that is at least 5 degrees off of perpendicular to the top surface of the substrate and/or isolation regions 106.

Figure 5:
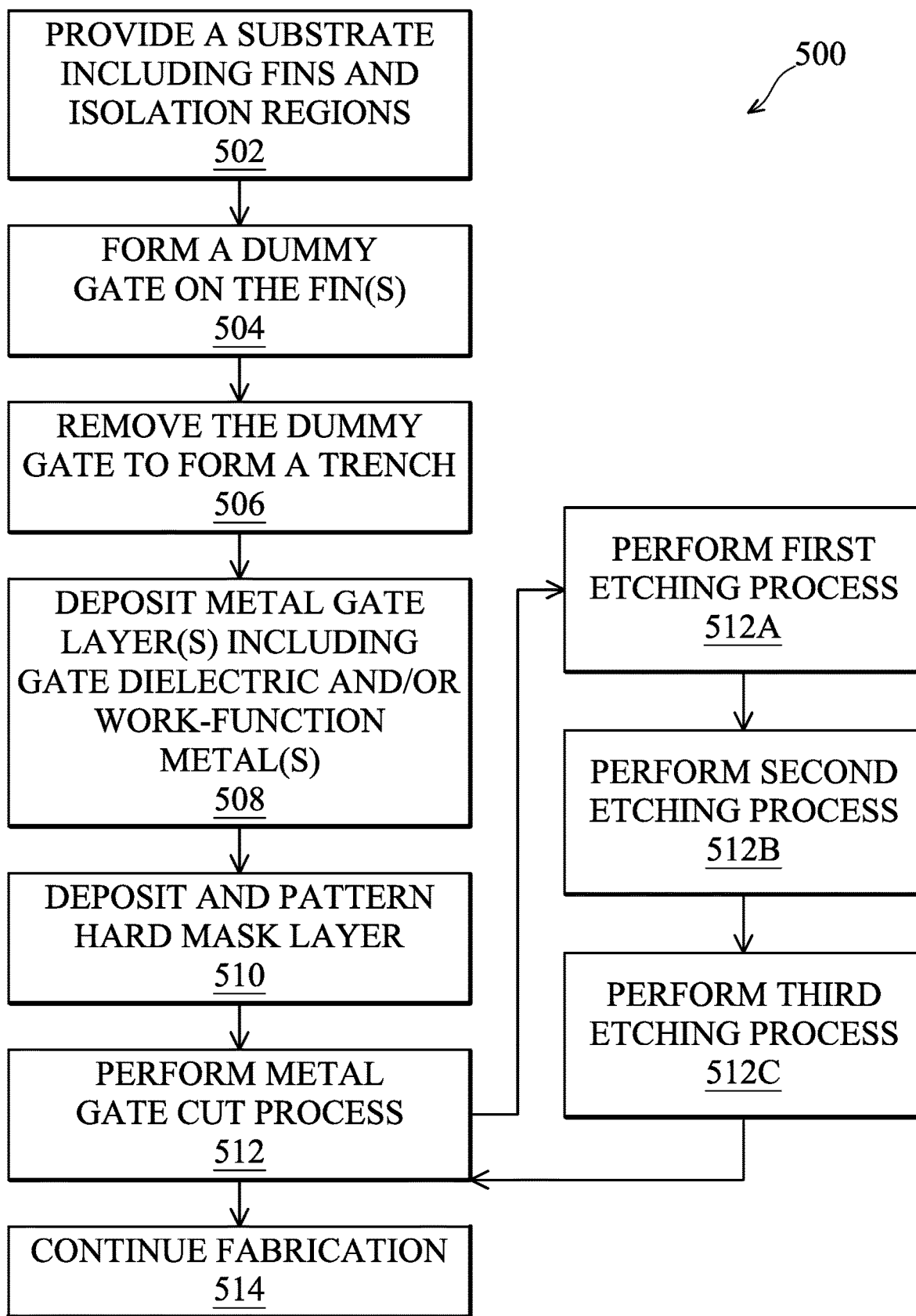
FIG. 5 is a flow chart of a semiconductor manufacturing method, according to one or more aspects of the present disclosure.

With reference now to FIG. 5, shown therein is a flow chart of a semiconductor manufacturing method 500, according to at least some embodiments. Additional steps may also be provided before, during, and after the method 500, and some steps described can be replaced, eliminated, or moved before or after other steps for additional embodiments of the method. It is also noted that the method 500 is exemplary, and is not intended to limit the present disclosure beyond what is explicitly recited in the claims that follow. The method 500 will be further described below in conjunction with FIGS. 6A, 6B, 7A, 7B, 8A, 8B, 8C, 9A, 9B, 10A, 10B, 10C, 11A, 11B, 11C, 12A, 12B, 12C, 13A, and 13B. FIGS. 6A, 7A, 8A, 9A, 10A, 11A, 12A, and 13A show cross-sectional views of a FinFET structure 600 along a plane substantially parallel to a plane defined by section XX' of FIG. 1, and FIGS. 6B, 7B, 8B, 9B, 10B, 11B, 12B, and 13B show cross-sectional views of the structure 600 along a plane substantially parallel to a plane defined by section YY' of FIG. 1.

In various embodiments, the method 500 begins at block 502 where a substrate including fins and isolation regions is provided. With reference to the example of FIGS. 6A and 6B, and in an embodiment of block 502, an illustrative structure 600 is shown. The substructure 600 may be part of a FinFET structure. The structure 600 may include one or more of the features described above with reference to the FIG. 1 such as fin elements 104 extending from a substrate 102, and isolation regions 106.

Figure 6A:
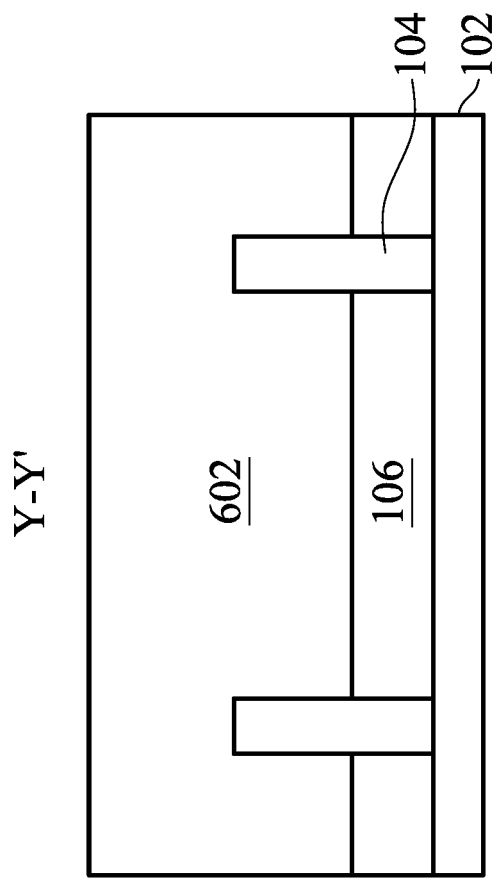
Figure 6B:
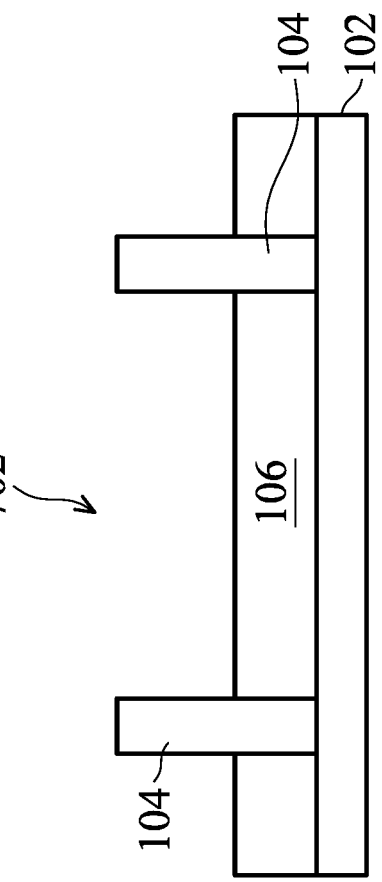

The method 500 then proceeds to block 504 where dummy gates are formed on the substrate. As illustrated in FIG. 6A and FIG. 6B, the dummy gate structure 602 is disposed on and around fin-elements 104.

The dummy gate structure 602 may include a gate stack having a dielectric layer (e.g., including an interfacial layer and/or a gate dielectric layer) and an overlying gate electrode layer. In some embodiments, the gate electrode layer is polysilicon. The gate dielectric layer of the dummy gate structure 602 may be sacrificial or in some embodiments, maintained in the final device. The dummy gate structure 602 may be subsequently removed from the substrate 102 including in a suitable gate replacement process that introduces a metal gate.

As illustrated in the example of FIG. 6A, the dummy gate structure 602 may have a "footing profile" such that a bottom width of the dummy gate structure 602 is greater than a top portion of the dummy gate structure 602. The "footing profile" includes a bottom portion having tapered sidewalls that extend from the greater bottom width to the lesser top width. The tapered sidewalls are also referred to as sidewalls orthogonal to a surface of the substrate 102 and/or a top surface of the isolation region 106. This "footing profile" may be generated from exposure, development, and/or etching processes used to form the dummy gate structure 602 and may include a configuration as discussed above with reference to FIG. 4.

An interlayer (ILD) dielectric 320 is disposed adjacent the dummy gate structure 602. The ILD layer 320 may be substantially similar to as discussed above at FIGS. 3 and 4.

Figure 7A:
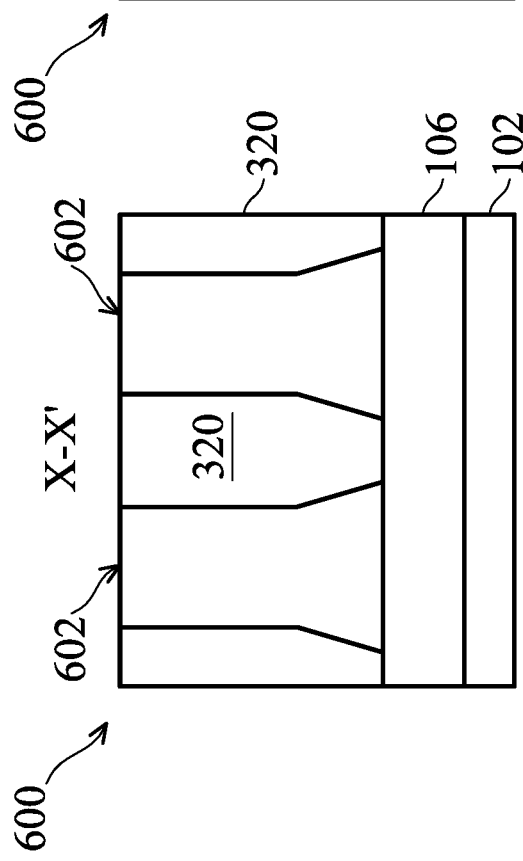
Figure 7B:
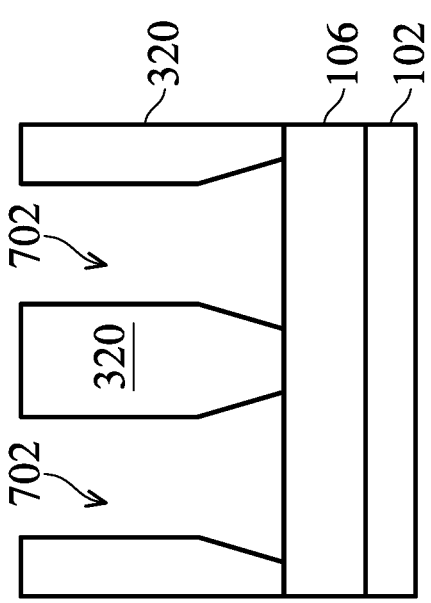

The method 500 then proceeds to block 506 where the dummy gate structure may be removed forming a trench over the substrate. In some embodiments, the trench is formed in the ILD layer 320, though certain other layers may also be used to define the trench sidewalls such as, for example, spacer elements disposed on the sidewalls of the dummy gate structure 602. The removal of the dummy gate structure may include wet and/or dry etching processes selective to the dummy gate structure 602. In one example, an etching solution including $HNO_3$, $H_2O$ and HF may be used to remove polysilicon of the dummy gate structure 602. In another example, chlorine (C1)-based plasma may be used to selectively remove a polysilicon layer. FIGS. 7A and 7B illustrate a trench 702 formed by the removal of the dummy gate structure 602.

The method 500 then proceeds to block 508 where a metal gate structure is formed in the trench provided by the removal of the dummy gate. The metal gate structure may include a plurality of layer(s) including one or more of an interfacial layer, a gate dielectric layer, work function layer(s), barrier layer(s), adhesion layer(s), diffusion layer(s), a metal fill layer, and/or other suitable layers formed within the trench.

Referring to the example of FIGS. 8A and 8B, a metal gate structure 804 is formed on the substrate 102 including over and around fins 104. The metal gate structure 804 includes a plurality of layers such as illustrated in the example of FIG. 8C. It is noted that the embodiment of FIG.

8C is exemplary only and not intended to be limiting in compositions, number of layers, or configuration of layers beyond what is specifically recited in the claims that follow.

The metal gate structure 804 may include a work function layer. In some embodiments, a work function metal layer includes a p-type work function metal (PWFM). Merely by way of example, the PWFM layer may include Ni, Pd, Pt, Be, Ir, Te, Re, Ru, Rh, W, Mo, WN, RuN, MoN, TiN, TaN, WC, TaC, TiC, TiAlN, TaAlN, or combinations thereof. In various embodiments, the PWFM layer may be formed using PVD, CVD, electron beam (e-beam) evaporation, and/or other suitable process. The metal gate structure 804 may include a work function layer of a metal layer including an n-type work function layer (NWFM) which may include, by way of example, Ni, Pd, Pt, Be, Ir, Te, Re, Ru, Rh, W, Mo, WN, RuN, MoN, TiN, TaN, WC, TaC, TiC, TiAlN, TaAlN, or combinations thereof. In various embodiments, the NWFM layer may be formed using PVD, CVD, electron beam (e-beam) evaporation, and/or other suitable process. In some embodiments, a fill metal layer, barrier layer(s), diffusion layers, and/or other suitable layers are included in the plurality of layers of the metal gate structure. Exemplary metal layers of the metal gate structure 804 may include other metals such as Ni, Pd, Pt, Be, Ir, Te, Re, Ru, Rh, W, Mo, WN, RuN, MoN, TiN, TaN, WC, TaC, TiC, TiAlN, TaAlN, or combinations thereof.

The metal gate structure 804 also includes a gate dielectric layer (and in some cases an underlying interfacial layer) under the metal layers of the metal gate structure 804. The gate dielectric layer may include a high-k dielectric such as hafnium oxide.

FIG. 8C illustrates an embodiment of the metal gate structure 804 illustrated as a stack of a plurality of layers comprising the metal gate structure 804'. The exemplary metal gate structure 804' of FIG. 8C includes a high-k gate dielectric layer 806. In an embodiment, the high-k dielectric layer 806 is hafnium oxide. In some embodiments, under the high-k gate dielectric 806 is an interfacial layer (e.g., silicon oxide), which is not shown. A first metal layer 808 is disposed on the high-k gate dielectric layer 806. In an embodiment, the first metal layer 808 is formed by depositing titanium nitride (TiN). In some embodiments, in the formed structure of the metal gate structure 804', the composition of the metal layer 808 may include TiN and silicon (e.g., due to diffusion from surrounding layers) or TiSiN. In an embodiment, the first metal layer 808 is formed by depositing tantalum nitride (TaN) or TaSiN. In some embodiments, in the formed structure of the metal gate structure 804', the composition of the metal layer 808 may include TaN and silicon (e.g., due to diffusion from surrounding layers).

A second metal layer 810 is disposed on the first metal layer 808. In an embodiment, the second metal layer 810 includes TaN. In an embodiment, the third metal layer 812 includes TiN. In an embodiment, the fourth metal layer 814 includes TiAl. In an embodiment, the fifth metal layer 816 (e.g., a fill metal layer) includes TiN. Thus, in some embodiments, the first metal layer 808 includes TiSiN, the second metal layer 810 includes TaN, the third metal layer 812 includes TiN, the fourth meal layer includes TiAl, and/or the fifth metal layer includes TiN. As a reminder, these compositions are exemplary and only limited to as specifically recited in the claims below. Any one or more of these layers may be formed using atomic layer deposition (ALD), physical vapor deposition (PVD), CVD including plasma enhanced CVD, and/or other suitable deposition processes. The gate structure 804' is surrounded by dielectric (annotated as element 320) such as the dielectric material of adjacent ILD layer or other dielectric features such as spacer elements formed abutting the gate structure.

It is noted that the method 500 may include one or more chemical mechanical polishing (CMP) processes are performed during the formation of the metal gate structure.

The method 500 proceeds to block 510 where a hard mask layer is deposited and patterned. In some embodiments, the hard mask layer may include a patterned silicon nitride (SiN) layer. Alternatively, in some embodiments, the hard mask layer may include a patterned dielectric layer such as silicon oxynitride, silicon carbide, or other suitable material. With reference to the example of FIGS. 8A and 8B, a hard mask layer 802 is deposited. With reference to the example of FIGS. 9A and 9B, the hard mask layer 802 is patterned. In some embodiments, the patterned hard mask layer 802 includes an opening(s) 902 that defines a region under which a metal gate line-cut is to be performed. For example, in some cases, the opening 902 may correspond to a metal gate cut pattern, similar to the metal gate cut pattern 210 of FIG. 2. In various embodiments, a portion of one or more of the gate structures 804 is exposed within the opening 902.

The method 500 proceeds to block 512 where a metal gate line-cut process is performed. With reference to the example of FIGS. 10A, 10B, 10C, 11A, 11B, 11C, and 12A, 12B, 12C, in an embodiment of block 512, a metal gate line-cut process is performed in a series of etching steps.

In some embodiments, block 512 is performed in three etching steps illustrated as block 512A, 512B, and 512C in FIG. 5. In an embodiment, blocks 512A, 512B, and 512C are performed sequentially and in order without interposing steps. In some embodiments, blocks 512A, 512B, and 512C are performed sequentially and in order, with interposing cleaning or rinse/dry steps. In some embodiments, each of blocks 512A, 512B, and 512C are performed by different tools for example, each etching step is performed in a different chamber.

The metal gate-cut process of block 512 may begin with a first etching process of block 512A. In an embodiment, the first etching process is a dry etch process. The first etching process may be an anisotropic etching process. For example, the first etching process may provide for cutting the metal gate structure with substantially vertical sidewalls resulting in the cut region.

In some embodiments, the first etching process includes dry etching parameters of one or more of the following.

| Gas | Cl2/SiCl4/Ar/CH4/O2/BCl3/CF4 |
| --- | --- |
| Pressure: | 3-10 mT |
| Post Cure: Gas: | O2/N2/H2 |
| Power | Power: 500~900 W |

In some embodiments, after the first etching process of block 512A there is undesired, residual metal gate material remaining in the cut region. As illustrated in FIG. 10A, a residual portion 1004 is provided after the first etching process forms the cut region 1002. In some embodiments, the residual portion 1004 includes a gate dielectric layer and an overlying metal containing layer(s) of the metal gate structure. In some embodiments the overlying metal containing layers in the residual portion 1004 include at least one of titanium or tantalum. In some embodiments the overlying metal containing layers in the residual portion 1004 include at least one of titanium nitride or tantalum nitride. In some embodiments the overlying metal containing layers in the residual portion 1004 include at least one of titanium or tantalum, nitrogen, and silicon (e.g., silicon having diffused from surrounding layers). FIG. 10C illustrates for the exemplary metal gate structure 804', after the first etching process of block 512A, the residual portion 1004' includes the gate dielectric layer 806 and the overlying metal containing layer 808. In some embodiments, the residual portion 1004' further includes portions of the metal containing layer 810. Thus, by way of example, in some embodiments, after the first etching process, portions of layers including titanium, tantalum, titanium/tantalum nitrogen (TiN/TaN), and/or titanium (or tantalum) nitrogen and silicon (TiSiN/TaSiN) remain in the cut region 1002. In an embodiment, one or more of these compositions remains from a portion of layer 808. In a further embodiment, a portion of the layer 810 also remains in the cut region 1002 and may also include titanium, tantalum, titanium/tantalum nitrogen (TiN/TaN). In the further embodiments, the layer 810 may include the other one of titanium or tantalum (as compared to layer 808) and/or be a nitride of the other one of titanium or tantalum. It is noted that FIG. 10B illustrates the first etching process extends into the STI structure 106. However, in other embodiments, the first etching process extends to the top surface of the STI structure 106. In some embodiments where the first etching process extends through the STI structure 106 to the substrate 102. It is noted as 8 illustrated in FIG. 10A that the residual portion 1004 may be disposed along a sidewall of the opening 1002 that has a length of sidewall (defined by the STI structure 106) below the plane of the top surface of the STI structure. In some embodiments, this sidewall of the opening would be linear and collinear with the upper sidewall of the opening.

Figure 14:
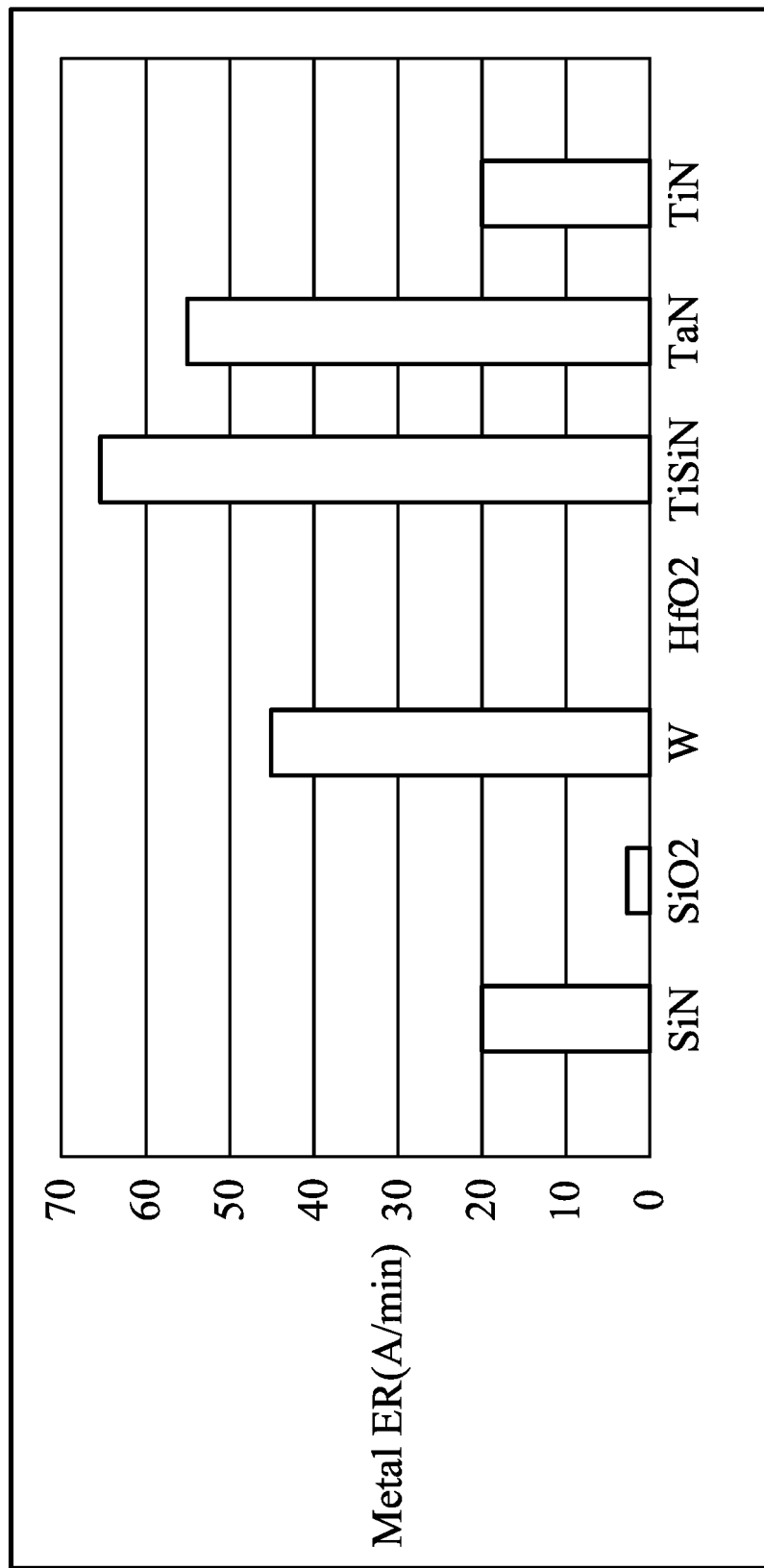
FIG. 14 illustrates etch rates of some embodiments of an etching step used in a cut-gate process according to some embodiments of the present disclosure.

The metal gate cut process of block 512 then proceeds to a second etching process of block 512B. In an embodiment, the second etching process is a dry etch process. The second etching process may be isotropic etching process (e.g., a dry etching isotropic process). In an embodiment, the second etching process is selected such that it has capability to etch TiN, TaN, TaSiN, W, and/or SiN. The second etching process may include $NF_3$ as an etchant. The second etching process may provide for etching TiN, TaN, and/or TaSiN compositions, without etching high-k dielectric. The second etching process may provide for etching TiN, TaN, and/or TaSiN compositions, without etching TiAl compositions. The second etching process may provide for etching TiN, TaN, and/or TaSiN compositions, without etching any surrounding dielectric such as the dielectric materials of the ILD layer 320, spacer elements, STI 106, etc. In an embodiment, the ILD layer 320 and/or the STI layer 106 include silicon oxide. The second etching process may be selective such that it does not substantially etch silicon oxide. In other words, the second etching process may be selected to provide for etching TiN, TaN, and/or TaSiN compositions, without etching silicon oxide. In some embodiments, due to the isotropic nature of the second etching process residual metal containing layers such as TaN, TiN, TaSiN, and/or TiSiN layers may be laterally etched in the cut region. The etch rates of an exemplary second etching process are provided in FIG. 14.

In some embodiments, the second etching process may be performed at between 50 and 75 degrees Celsius. In some embodiments, the second etching process may be performed for between approximately 60 and 180 seconds. In an embodiment, the gas of the second etching process includes $NF_3$. In some embodiments, the gas further includes $O_2$.

As illustrated in FIG. 11A, the residual portion 1004 provided after the first etching process is etched (including laterally) by the second etching process to provide a remaining residual portion 1102. That is, after the second etching process, the remaining residual portion 1102 is disposed in the cut region 1002 as illustrated in FIG. 11A. In some embodiments, the remaining residual portion 1102 includes material of the gate dielectric layer. FIG. 11C illustrates for the exemplary metal gate structure 804', after the second etching process of block 512B (e.g., after dry isotropic etch), the remaining residual portion 1102' includes the gate dielectric layer 806. Thus, by way of example, in some embodiments, after the second etching process, portions of the gate dielectric layer 806 including a high-k dielectric (e.g., $HFO_2$) remains.

In some embodiments, the second etching process has an etch rate of TiSiN greater than TaN and/or an etch rate of TaN greater than TiN. In some embodiments, the hard mask or BARC etch rate is approximately 4.5 to 12 Angstroms/minute. The etch rate for the hard mask or BARC can thus be controlled such as to minimize BARC/HM loss.

It is noted that in some embodiments, the second etching process uses an etchant including Fluorine (F), which can penetrate into the ILD layer 320 during the etching. In some embodiments, this can increase the thickness of the ILD layer 320 from before the second etching process 512B to after the second etching process 512B. In some embodiments, the ILD layer 320 includes silicon dioxide ($SiO2$), which includes F ions after the second etching process is performed.

The metal gate-cut process of block 512 then proceeds to a third etching process of block 512C. In an embodiment, the third etching process may be a wet etching process. In some embodiments, the third etching process includes a dilute hydrofluoric acid etch. For example, a dilute HF (DHF) etchant of between approximately 500 (DI):1 (HF) and 2000 (DI):1 part (HF) may be used. In some embodiments, the third etching process has an etchant selected to remove any residual gate dielectric layer (e.g., high-k dielectric) from the substrate. In some embodiments, the third etching process is selective to the composition of the gate dielectric layer (e.g., high-k dielectric such as $HfO_2$). For example, the etchant of the third etching process may not substantially etch the hard mask or other dielectric layers such as the ILD 320 or isolation region 106. As illustrated in the examples of FIGS. 12A, 12B, and 12C the residual portion 1102 has been removed from the substrate 102 after the third etching process. Due to the original "footing profile" of the metal gate structure 804, the resulting opening 1002 of the cut metal gate process also includes a width at one portion that is wider than other portions (e.g., a top region and a bottom region within the STI 106).

It is noted that the profile of the opening 1002 has a profile characterized by a larger width W3 at a point coplanar with a top surface of the STI 106. The larger width tapers to a substantially constant width W1 in an upper portion. The lower portion, below the larger width, may also get substantially constant width W2. In an embodiment, the taper of the profile from width W3 to width W1 at an angle between approximately 75 and less than 90 degrees. In other words, the sidewalls of the opening 1002 are orthogonal to a top surface of the underlying substrate 102. The sidewalls of a region of the opening 1002 above and below the width W3 include sidewalls that are collinear with one another and/or substantially perpendicular a top surface of the substrate 102.

Thus, the block 512 provides a multi-step etching process that removes portions of the metal gate structure 802 in the line cut region 1002. In some embodiments, the line-cut region 1002 extends into the underlying isolation regions 106 and effectively separates conductive gate metal layers in now-adjacent gate stacks from one another. In other embodiments, the line cut region 1002 extends through the isolation regions 106. Thus, the opening 1002 can extend to a surface of the substrate 102.

As described above, series of etching steps in block 512, embodiments of the present disclosure may not require the significant over etching of the metal layers within the cut region to damage to adjacent dielectric layers, yet can provide for removal of undesired residual layer(s) of the metal gate structure in the line-cut region. The removal of the residue can result in improved EBI device performance. The controlled etching processes can provide for reduced metal lateral etching that would result in over etching of the metal layers. For example, in some embodiments, the steps of block 512 can be provided such that the etching minimizes and/or prevents loss of the overlying hard mask (e.g., hard mask 802). Thus, in one or more embodiments of the present disclosure, a process window can be enlarged for the cut-metal gate process. In some embodiments, the width W1 can be a critical dimension adequately maintained during the cut process having selective etching as discussed above.

The method 500 proceeds to block 514 where fabrication is continued on the structure 600. In some embodiments, a dielectric layer is deposited in the cut region. In further embodiments, a CMP process is performed. With reference to the example of FIGS. 13A and 13B, and in an embodiment of block 514, a dielectric layer 1302 may be deposited and a CMP process is performed to planarize a top surface of the dielectric layer 1302. In some embodiments, the dielectric layer 1302 may include silicon oxide, silicon nitride, oxynitride, and/or other suitable dielectric material layer. Thus, in various embodiments, the dielectric layer 1302 may further serve to electrically isolate gate metal lines of neighboring gate stacks. Dielectric layer 1302 may be a different composition that than of the ILD layer 320 and/or the isolation region 106.

The FinFET structure 600 may continue to undergo further processing to form various features and regions known in the art. For example, subsequent processing may form various contacts/vias/lines and multilayers interconnect features (e.g., metal layers and interlayer dielectrics) on the substrate, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first fin and a second fin extending from a substrate and extending in a first direction, the first fin having a first gate region and the second fin having a second gate region and a shallow trench isolation (STI) structure interposing the first and second fins;
   a first portion of a metal gate structure disposed over the first gate region and a second portion of the metal gate structure disposed over the second gate region, wherein the first and second portions are separated by a cut gate region and wherein the metal gate structure extends in a second direction, the second direction perpendicular to the first direction; and
   a dielectric layer disposed in the cut gate region, wherein the dielectric layer extends below a top surface of the STI structure;
   wherein the first portion of the metal gate structure has a first face abutting the cut gate region, wherein the first face is parallel the first direction and the first face has a first width measured in the first direction adjacent the top surface of the STI structure and a second width above the first width and measured in the first direction, the second width less than the first width.

2. The semiconductor device of claim 1, wherein the first and second portions are collinear.

3. The semiconductor device of claim 1, the cut gate region includes a first dielectric material having the first width adjacent the STI structure and the second width above the first width, and a third width above the second width, wherein the second width is different than the first width and the third width is different than the second width.

4. The semiconductor device of claim 1, wherein the first face of the first portion of the metal gate structure has a tapered profile from the second width to the first width.

5. The semiconductor device of claim 1, wherein the STI structure extends from interfacing the first fin to interfacing the second fin.

6. The semiconductor device of claim 1, wherein the dielectric layer extends to the substrate underlying the STI structure.

7. The semiconductor device of claim 1, wherein the dielectric layer in the cut gate region includes a third width measured in the first direction at a region interfacing the top surface of the STI structure and a fourth width measured in the first direction at a region extending below the top surface of the STI structure, wherein the fourth width is less than the third width.

8. The semiconductor device of claim 1, wherein the dielectric layer extends below the top surface of the STI structure to a first point in the STI structure, wherein the first point is between approximately 10% and 70% of a thickness of the STI structure.

9. A semiconductor device, comprising:
   a first portion of a metal gate line and a collinear second portion of the metal gate line, wherein the first portion has a first end and the collinear second portion has a second end; and
   a dielectric layer extending from the first end to the second end; and
   a shallow trench isolation structure underlying the dielectric layer;
   wherein the dielectric layer has:
      a first width defined as extending from an interface with a first sidewall of the shallow trench isolation structure to an interface with a second sidewall of the shallow trench isolation structure;
      a second width above the first width wherein the second width is defined at a region above the interface with the shallow trench isolation structure, the second width greater than the first width; and a third width defined above the second width, wherein the third width is less than the second width.

10. The semiconductor device of claim 9, wherein the dielectric layer has a first composition and the shallow trench isolation structure has a second composition different than the first composition.

11. The semiconductor device of claim 9, wherein the first portion of the metal gate line includes a plurality of work function layers and the collinear second portion of the metal gate line includes the same plurality of work function layers.

12. The semiconductor device of claim 9, wherein the dielectric layer has tapered sidewalls extending from the second width to the third width.

13. The semiconductor device of claim 9, wherein the third width is approximately equal to the first width.

14. The semiconductor device of claim 9, wherein the dielectric layer has the first width extending from the interface of the first sidewall of the shallow trench isolation structure to the interface with the second sidewall of the shallow trench isolation structure for a distance of between 10% and 70% of a thickness of the shallow trench isolation structure.

15. The semiconductor device of claim 9, further comprising:

an interlayer dielectric (ILD) layer disposed over the shallow trench isolation structure and abutting the dielectric layer.

16. The semiconductor device of claim 15, wherein the ILD layer has a different composition than the dielectric layer.

17. A semiconductor device, comprising:

a first fin and a second fin extending vertically from a substrate and extending in a first direction;

a first metal gate structure disposed over a region of the first fin, wherein the first metal gate structure extends in a second direction, the second direction perpendicular to the first direction;

a second metal gate structure disposed over a region of the second fin and extends in the second direction, wherein the first and second metal gate structures are separated by a cut gate region filled with dielectric material; and wherein the first metal gate structure has a first face abutting the dielectric material of the cut gate region, wherein the first face is parallel the first direction and wherein the first face has a first width adjacent the STI structure and a second width above the first width, the second width less than the first width and the first width and the second width each defined in the first direction.

18. The semiconductor device of claim 17, wherein the dielectric material extends below a top surface of the STI structure.

19. The semiconductor device of claim 17, wherein the first metal gate structure includes an n-type work function metal.

20. The semiconductor device of claim 17, wherein the first metal gate structure includes a gate stack of a high-k dielectric layer, a TiN layer, and a TaN layer.

* * * * *